US005728503A

United States Patent [19]

Dhillon et al.

[11] Patent Number: 5,728,503
[45] Date of Patent: Mar. 17, 1998

[54] LITHOGRAPHIC PRINTING PLATES HAVING SPECIFIC GRAINED AND ANODIZED ALUMINUM SUBSTRATE

[75] Inventors: Major S. Dhillon, Belle Mead; Gerhard Sprintschnik, Branchburg; Jose G. Gonzales, Roebling, all of N.J.

[73] Assignee: Bayer Corporation, Pittsburgh, Pa.

[21] Appl. No.: 566,759

[22] Filed: Dec. 4, 1995

[51] Int. Cl.$^{6}$ .................... G03F 7/09

[52] U.S. Cl. .................... 430/158; 430/157; 430/278.1

[58] Field of Search .................... 430/157, 158, 430/278.1

[56] References Cited

U.S. PATENT DOCUMENTS

| | | | |
|---|---|---|---|
| 4,087,342 | 5/1978 | Takahashi et al. | 204/129.43 |
| 4,336,113 | 6/1982 | Walls et al. | 204/17 |
| 4,374,710 | 2/1983 | Walls | 204/33 |
| 4,396,468 | 8/1983 | Walls | 204/17 |
| 4,416,972 | 11/1983 | Walls et al. | 430/278 |
| 4,655,136 | 4/1987 | Reiss et al. | 101/459 |

FOREIGN PATENT DOCUMENTS

| | | |
|---|---|---|
| 0701908A2 | 3/1996 | European Pat. Off. . |
| 2019022 | 10/1979 | United Kingdom . |
| 2047274 | 11/1980 | United Kingdom . |

*Primary Examiner*—Christopher G. Young
*Attorney, Agent, or Firm*—Roberts & Mercanti, L.L.P.

[57] ABSTRACT

The present invention relates to supports for lithographic printing plates and to a process for producing the same. In particular, the invention relates to aluminum plates having an electrochemically grained and anodized surface which is has a smooth, shiny surface and hence greater image contrast when a lithographic image is formed thereon. The surface has a substantially uniform surface topography comprising peaks and valleys and surface roughness parameters wherein Ra ranges from about 0.10 to about 0.50 microns, Rz ranges from about 0.00 to about 5.00 microns, Rt ranges from about 0.00 to about 6.00 microns and Rp ranges from about 0.00 to about 4.00 microns. The surface preferably has tristimulus color coordinate values wherein L ranges from about 35.00 to about 75.00, a ranges from about −4.00 to about +4.00 and b ranges from about −4.00 to about +4.00.

7 Claims, No Drawings

LITHOGRAPHIC PRINTING PLATES HAVING SPECIFIC GRAINED AND ANODIZED ALUMINUM SUBSTRATE

BACKGROUND OF THE INVENTION

1. Field of the Invention

The present invention relates to supports for lithographic printing plates and to a process for producing the same. In particular, the invention relates to aluminum plates having a surface which is smooth and shiny, and hence has greater image contrast when a lithographic image is formed thereon.

2. Description of the Prior Art

It is well known in the art to prepare lithographic printing plates by coating the surface of an aluminum support with a photosensitive composition, imagewise exposing the dried composition to actinic radiation and developing to remove the nonimage portions of the composition.

It is also known in the art that such photographic compositions have poor adhesion to mill finished aluminum since the surface is exceedingly soft and lustrous, and retains considerable amounts of milling oils. Images produced directly on mill finished aluminum plates easily peel from the surface of the support under the physical forces of printing and, consequently, the printing durability deteriorates.

In general, the practical use of aluminum substrates as supports for lithographic printing plates requires that they undergo several processing steps. The surface must be degreased of milling oils and roughened by a chemical etching and/or graining step to improve adhesion to a photosensitive layer and to improve water retention properties. Prior art graining treatments for roughening an aluminum surface are performed by mechanical graining such as ball graining, wire graining, brush graining, and electrochemical graining.

In addition, since the aluminum surface grained by these processes is comparatively soft and easily abraded, it is usually subjected to an anodizing treatment to form an oxide film thereon. The resulting surface of the processed aluminum plate is hard, has excellent abrasion resistance, good water affinity and retention, and good adhesion to the photosensitive layer. Typically the surface is then sealed with a hydrophilizing composition and coated with a photosensitive composition.

One problem in the art is that grained and anodized plates have a dull gray appearance as compared to original, untreated mill finished aluminum surface. As a result, when a lithographic image is formed thereon, the visual contrast between the image and nonimage areas is poor and the printer has difficulty in evaluating the quality of the image. It would therefore be desirable to produce an aluminum surface which has both a smooth, shiny surface which allows improved image contrast, and yet has the image adhesion and surface hardness of a grained and anodized plate surface.

The useful qualities of aluminum surfaces are determined by its surface topography, smoothness and color characteristics. The microstructure of the surface of an aluminum support has a great influence on the performance of the plate in use as a support for lithographic printing plates. It has been found that the aluminum surfaces produced according to the present invention provide excellent lithographic supports. They have superior affinity for water, adhesion to lithographic coatings and a hard durable surface. In addition, since the aluminum plates of this invention have high brightness upon anodic oxidation, a lithographic printing plate produced therefrom has improved image contrast. The quality of the image areas can easily be examined by the printer due to the high contrast between the image areas and non-image areas. Further, this lithographic printing plate has good printing durability, because the image areas do not readily peel off during printing due to the distribution of peaks and valleys making up the surface structure.

SUMMARY OF THE INVENTION

The invention provides a support for a lithographic printing plate which comprises an aluminum substrate having a grained and anodized surface and having a substantially uniform surface topography comprising peaks and valleys and surface roughness parameters Rz, Rt, Rp and Ra wherein Ra ranges from about 0.10 to about 0.50 microns, Rz ranges from about 0.00 to about 5.00 microns, Rt ranges from about 0.00 to about 6.00 microns and Rp ranges from about 0.00 to about 4.00 microns.

The invention further provides a lithographic printing plate comprising the above support and a light sensitive composition layer on the surface.

The invention further provides a process for producing a support for a lithographic printing plate which comprises subjecting the surface of an aluminum substrate to graining and anodizing treatments to thereby produce a substantially uniform surface topography comprising peaks and valleys and surface roughness parameters Rz, Rt, Rp and Ra wherein Ra ranges from about 0.10 to about 0.50 microns, Rz ranges from about 0.00 to about 5.00 microns, Rt ranges from about 0.00 to about 6.00 microns and Rp ranges from about 0.00 to about 4.00 microns. Preferably the surface is subjected to one or more treatments selected from the group consisting of a chemical degreasing, chemical etching and electrochemically graining.

DETAILED DESCRIPTION OF THE PREFERRED EMBODIMENT

In order to produce the lithographically suitable sheet of the present invention, one begins with a lithographic grade aluminum or aluminum alloy substrate. Suitable substrates for the manufacture of lithographic printing plates include Alcoa 3003 and Alcoa 1100. The aluminum substrates used in the present invention include those composed of substantially pure aluminum and aluminum alloys. Aluminum alloys include alloys of aluminum and materials such as silicon, copper, manganese, magnesium, chromium, zinc, lead, bismuth or nickel.

As a first step, the substrate is degreased to remove milling oils. Degreasing is preferably conducted by passing the substrate through an aqueous solution of an alkali hydroxide, such as sodium hydroxide which is present in the solution at a concentration of from about 5 to about 25 g/l The solution is preferably maintained at about 100° F. to about 200° F. Degreasing may be conducted at from about 10 to about 180 seconds. Next, the substrate is preferably chemically etched. This is preferably done by passing the substrate through a second aqueous solution of an alkali hydroxide, such as sodium hydroxide which is present in the solution at a concentration of from about 5 to about 25 g/l. The solution is preferably maintained at about 100° F. to about 200° F. Chemical etching may also be conducted at from about 10 to about 180 seconds.

The substrate is then electrochemically grained. Electrochemical graining is preferably done by electrolyzing the substrate in an aqueous solution of nitric or hydrochloric acid at a concentration of from about 8 g/l to about 20 g/l, preferably from about 10 g/l to about 16 g/l and most preferably from about 12 to about 14 g/l. Preferably, if nitric acid is used, aluminum nitrate is also added to the solution and if hydrochloric acid is used, then aluminum chloride is added to the solution. The aluminum chloride or aluminum nitrate is preferably added in an amount of from about 5 to about 100 g/l, more preferably from about 20 to about 80 g/l and most preferably from about 40 to about 60 g/l.

The graining is preferably conducted in either direct or alternating current, however alternating current is most preferred. Graining is performed at a charge density of from about 5 to about 100 coulombs/$dm^2$, preferably from about 10 to about 70 coulombs/$dm^2$ and more preferably from about 40 to about 60 coulombs/$dm^2$. Graining is done for from about 5 seconds to about 5 minutes. Most preferably, graining is conducted with nitric acid, aluminum nitrate and alternating current.

The substrate is then preferably anodized. Anodizing may be performed by electrolytically treating the substrate in an aqueous solution of sulfuric or phosphoric acid having a concentration of from about 100 to about 300 g/l at a temperature of from about 100° F. to about 200° F. Sulfuric acid is most preferred. Anodizing preferably takes place for about from 5 seconds to about 5 minutes at a charge density of about from about 20 to about 100 coulombs/$dm^2$. Anodizing produces an anodic oxide weight of from about 0.1 to about 2.5 g/$m^2$, preferably from about 0.2 to about 1.0 g/$m^2$ and more preferably from about 0.4 to about 0.6 g/$m^2$.

The surface microstructure of the plate is measured by a profilometer, such as a Perthometer model S5P which is commercially available from Mahr Feinpruef Corporation of Cincinnati, Ohio. Topography measurements of the surface grain structure of peaks and valleys are made according to DIN 4768 wherein the parameters of importance for this invention are Rz, Rt, Rp and Ra. In the measurement procedure, a measurement length Im over the sample surface is selected. Rz is the average roughness depth and is measured as the mean of the highest peak to lowest valley distances from five successive sample lengths Io where Io is Im/5. Rt is the maximum roughness depth and is the greatest perpendicular distance between the highest peak and the lowest valley within the measurement length Im. Rp is the maximum levelling depth and is the height of the highest peak within the measuring length Im. Ra, or average roughness, is the arithmetic mean of the absolute values of the peak heights and valley depths within the measuring length Im.

The surface treatments carried out produce a surface structure having peaks and valleys which produce roughness parameters wherein Ra ranges from about 0.10 to about 0.50 microns, preferably from about 0.20 to about 0.40 microns, and most preferably from about 0.25 to about 0.35 microns. The Rz value ranges from about 0.00 to about 5.00 microns, preferably from about 1.00 to about 4.00 microns, and more preferably from about 2.50 to about 3.50 microns. Rt ranges from about 0.00 to about 6.00 microns, preferably from about 1.00 to about 5.00 microns and more preferably from about 2.00 to about 4.00 microns. Rp ranges from about 0.00 to about 4.00 microns, preferably from about 1.00 to about 3.00 microns and more preferably from about 1.50 to about 2.50 microns.

The support has a bright, white surface. Resulting substrates have a brightness and color which may be measured according to the Hunter Color Space evaluation system and the tristimulus coordinate values which are well known to the skilled artisan. Such may be measured by a Milton Roy Color-Mate Analyzer, available from Milton Roy Co., Rochester, N.Y. In the eye, cone receptors code light to dark, red to green and yellow to blue signals. In the Hunter Space System, the letter "a" denotes redness (positive value) to green (negative value), the letter "b" denotes yellowness (positive value) to blueness (negative value). The lightness variable "L" ranges from 0 for black to 100 for white. The Hunter a, b and L scales establish a translation between the 1931 CIE Standard Observer system and a quantitative system approximating the responses of the human eye-brain combination. The scales produce an opponent-colors system for reproducing visual response to color, regardless of surface interference. Measurement procedures are more fully set forth in ASTM E308-85.

The support of this invention has a surface having tristimulus color coordinate values L, a and b wherein L ranges from about 35.00 to about 75.00, preferably from about 54.00 to about 64.00, and more preferably from about 56.00 to about 62.00. Each of the "a" and "b" parameters independently range from about −4.00 to about +4.00, preferably from about −2.50 to about +2.50 and more preferably from about −1.50 to about +1.50.

In the production of a lithographic printing plate, the substrate is then preferably treated with an aqueous solutions of a hydrophilizing compound such as alkali silicate, silicic acid, Group IV-B metal fluorides, the alkali metal salts, polyvinyl phosphonic acid, polyacrylic acid, the alkali zirconium fluorides, such as potassium zirconium hexafluoride, or hydrofluozirconic acid in concentrations of from about 0.01 to about 10% by volume. A preferred concentration range is from about 0.05 to about 5% and the most preferred range is from about 0.1 to about 1%.

Next, a light sensitive composition may be coated onto the hydrophilized substrate and dried. The coating is preferably applied to a properly prepared lithographic plate substrate by any well known coating technique and, after coating solvents are evaporated, yield a dry coating weight of from about 0.1 to about 2.0 g/$m^2$, or more preferably from about 0.2 to about 1.0 g/$m^2$ and more preferably from about 0.4 to about 0.6 g/$m^2$. The light sensitive composition preferably comprises a diazonium compound in admixture with a binding resin and colorant. Such are described in U.S. Pat. Nos. 3,867,147; 3,849,392 and 4,940,646 which are incorporated herein by reference.

The thusly produced lithograohic printing plate may then be exposed to ultraviolet or actinic radiation in the 350 to 450 nanometer range through a photographic mask and developed. Suitable uv light sources are carbon arc lamps, xenon arc lamps, mercury vapor lamps which may be doped with metal halides (metal halide lamps), fluorescent lamps, argon filament lamps, electronic flash lamps and photographic floodlight lamps.

Typical developer compositions can be alkaline or neutral in nature and have a pH range of from about 5 to about 9. Developers are preferably formed from aqueous solutions of phosphates, silicates or metabisulfites. Such non-exclusively include mono-, di- and tri- alkali metal phosphate, sodium silicate, alkali metal metasilicate and alkali metabisulfite. Alkali metal hydroxides may also be used although these are not preferred. The developers may also contain art recognized surfactants, buffers and other ingredients.

The following non-limiting examples will serve to illustrate the invention. It will be appreciated that variations in proportions and alternatives in elements of the components of the photosensitive coating composition will be apparent to those skilled in the art and are within the scope of the present invention.

EXAMPLE 1 (COMPARATIVE)

A lithographic grade 1050 alloy aluminum web was degreased and etched in sodium hydroxide solution, anodized to an oxide weight of 3.0 g/m$^2$ in sulfuric acid solution and sealed with polyvinyl phosphonic acid. In this comparative example, the aluminum is not electrochemically grained. The processed web was coated with a light sensitive coating. The light sensitive coating comprises a diazo resin as described in U.S. Pat. Nos. 3,867,147 and 3,849,392 and a modified polyvinyl acetal resin as described in U.S. Pat. No. 4,940,646. The coating formulation is given below:

| Ingredient | Weight Percent |
|---|---|
| Propylene glycol methyl ether (Dowanol PM) | 51.853 |
| Butyrolactone (BLO) | 11.507 |
| Tetrahydrofuran (THF) | 25.170 |
| Resin (8.5% in MEK) (U.S. Pat. No. 4,940,646) | 3.700 |
| Phosphoric acid (85%) | 0.040 |
| p-azo diphenylamine (PADA) | 0.010 |
| Diazonium (U.S. Pat. No. 3,867,147) | 0.780 |
| Blue Dispersion (given below) | 6.940 |

The composition of Blue Dispersion is:

| Ingredient | Weight Percent |
|---|---|
| Dowanol PM | 66.0 |
| Butyrolactone (BLO) | 22.0 |
| Resin (U.S. Pat. No. 4,940,646) | 6.0 |
| Copper phthalocyanine (Blue B2G) | 6.0 |

The aluminum web was coated to 0.5 g/m$^2$ coating weight. The coated plate was exposed to U.V. light (365 nm) through a negative mask for 30 seconds using a Teaneck exposure unit (Teaneck Graphics Systems, Teaneck, N.J., using a L1250 UV light source from Oleck Corporation, Irvine, Calif.). The exposed plate was developed in an aqueous developer (available commercially as ND-143 from Hoechst Celanese Corporation, Printing Products Division, Branchburg, N.J.). ND-143 developer composition is given below:

| Ingredient | Weight percent |
|---|---|
| Potassium hydroxide | 1.4 |
| Potassium tetraborate | 1.0 |
| Poly-n-vinyl-n-methyl acetamide | 0.5 |
| Nonanoic acid | 4.0 |
| Dodecyl benzene sodium sulfonate | 1.4 |
| Sodium hexametaphosphate | 2.0 |
| Phenoxyethanol | 4.0 |
| Water | remainder |

The developed plate was discarded because it exhibited an image lift off in less than 500 printed press impression. This example produces an unsatisfactory plate which is not electrochemically grained.

EXAMPLE 2

A lithographic grade 1050 aluminum alloy web was degreased and etched in sodium hydroxide solution and grained with alternating current in nitric acid using three graining stations to form just enough grains for the coating to have a good adhesion but not enough grains to make the surface appear grained to the naked eye. The partially grained substrate appeared ungrained, shiny and smooth. The grain structure was obtained under the following conditions:

Nitric acid concentration: 15.5 g/l

Aluminum nitrate concentration: 60.0 g/l

Charge density at each grainer: 40 Coulombs/dm$^2$

The web having this partial grain was anodized to a oxide weight of 0.5 g/m$^2$ and the surface was then sealed with polyvinyl phosphonic acid. The sealed substrate was coated with a light sensitive coating as described in Example 1. The coated plate after processing by the method of Example 1 provided 50,000 acceptable printed press sheets.

EXAMPLE 3

A lithographic grade 1050 alloy aluminum web was degreased and etched in sodium hydroxide solution and grained with direct current in nitric acid using three graining stations to form just enough grains for the coating to have a good adhesion but not enough grains to make the surface appear grained to the naked eye. The partially grained substrate appeared ungrained, shiny and smooth. The grain structure was obtained under the following conditions:

Nitric acid concentration: 12.5 g/l

Aluminum nitrate concentration: 60.0 g/l

Charge density at each grainer: 40 Coulombs/dm$^2$

The web having this partial grain was anodized to a oxide weight of 0.5 g/m$^2$ and the surface was then sealed with polyvinyl phosphonic acid. The sealed substrate was coated with a light sensitive coating as described in Example 1. The coated plate after processing by the method of Example 1 provided 45,000 acceptable printed press sheets.

EXAMPLE 4

A lithographic grade 1050 alloy aluminum web was degreased and etched in sodium hydroxide solution and grained with an alternating current in hydrochloric acid using three graining stations to form just enough grains for the coating to have a good adhesion but not enough grains to make the surface appear grained to the naked eye. The partially grained substrate appeared ungrained, shiny and smooth. The grain structure was obtained under the following conditions:

Hydrochloric acid concentration: 12.5 g/l

Aluminum chloride concentration: 60.0 g/l

Charge density at each grainer: 40 Coulombs/dm$^2$

The web having this partial grain was anodized to a oxide weight of 0.5 g/m$^2$ and the surface was then sealed with polyvinyl phosphonic acid. The sealed substrate was coated with a light sensitive coating as described in Example 1. The coated plate after processing by the method of Example 1 provided 45,000 acceptable printed press sheets.

EXAMPLE 5

A lithographic grade 3103 alloy aluminum web was degreased and etched in sodium hydroxide solution and grained with direct current in nitric acid to form just enough grains for the coating to have a qood adhesion but not enough grains to make the surface appear grained to the naked eye. The partially grained substrate appeared ungrained, shiny and smooth. The grain structure was obtained under the following conditions:

Nitric acid concentration: 12.5 g/l

Aluminum nitrate concentration: 60.0 g/l

Charge density at each grainer: 30 Coulombs/$dm^2$

The web having this partial grain was anodized to a oxide weight of 0.5 $g/m^2$ and the surface was then sealed with polyvinyl phosphonic acid. The sealed substrate was coated with a light sensitive coating as described in Example 1. The coated plate after processing by the method of Example 1 provided 45,000 acceptable printed press sheets.

EXAMPLE 6

A lithographic grade 1050 alloy aluminum web was degreased and etched in sodium hydroxide solution and grained with alternating current in nitric acid to form just enough grains for the coating to have a good adhesion but not enough grains to make the surface appear grained to the naked eye. The partially grained substrate appeared ungrained, shiny and smooth. The grain structure was obtained under the following conditions:

Nitric acid concentration: 14.5 g/l

Aluminum nitrate concentration: 60.0 g/l

Charge density at each grainer: 50 Coulombs/$dm^2$

The web having this partial grained surface without anodizing was sealed with polyvinyl phosphonic acid. The sealed substrate was coated with a light sensitive coating as described in Example 1. The coated plate after processing by the method of Example 1 provided 5,000 acceptable printed press sheets. The surface was not anodized.

EXAMPLE 7

A lithographic grade 1050 aluminum alloy web was degreased and etched in sodium hydroxide solution and grained with alternating current in nitric acid to form just enough grains for the coating to have a good adhesion but not enough grains to make the surface appear grained to the naked eye. The partially grained substrate appeared ungrained, shiny and smooth. The grain structure was obtained under the following conditions:

Nitric acid concentration: 15.5 g/l

Aluminum nitrate concentration: 60.0 g/l

Charge density at each grainer: 20 Coulombs/$dm^2$

The web having this partial grain was anodized to a oxide weight of 0.5 $g/m^2$ and the surface was then sealed with polyvinyl phosphonic acid. The sealed substrate was coated with a light sensitive coating as described in Example 1. The coated plate after processing by the method of Example 1 provided 20,000 acceptable printed press sheets.

EXAMPLE 8

A lithographic grade 1050 aluminum alloy web was degreased and etched in sodium hydroxide solution and grained with alternating current in nitric acid to form just enough grains for the coating to have a good adhesion but not enough grains to make the surface appear grained to the naked eye. The partially grained substrate appeared ungrained, shiny and smooth. The grain structure was obtained under the following conditions:

Nitric acid concentration: 15.5 g/l

Aluminum nitrate concentration: 60.0 g/l

Charge density at each grainer: 10 Coulombs/$dm^2$

The web having this partial grain was anodized to a oxide weight of 0.5 $g/m^2$ and the surface was then sealed with polyvinyl phosphonic acid. The sealed substrate was coated with a light sensitive coating as described in Example 1. The coated plate after processing by the method of Example 1 provided 10,000 acceptable printed press sheets.

EXAMPLE 9

A lithographic 1050 aluminum alloy web was degreased and etched in sodium hydroxide solution and grained with alternating current in nitric acid to form just enough grains for the coating to have a good adhesion but not enough grains to make the surface appear grained to the naked eye. The partially grained substrate appeared ungrained, shiny and smooth. The grain structure was obtained under the following conditions:

Nitric acid concentration: 15.5 g/l

Aluminum nitrate concentration: 60.0 g/l

Charge density at each grainer: 5 Coulombs/$dm^2$

The web having this partial grain was anodized to a oxide weight of 0.5 $g/m^2$ and the surface was then sealed with polyvinyl phosphonic acid. The sealed substrate was coated with a light sensitive coating as described in Example 1. The coated plate after processing by the method of Example 1 provided 2,000 acceptable printed press sheets. Charge density is at the low end of the scale for this invention.

EXAMPLE 10 (COMPARATIVE)

A lithographic 1050 aluminum alloy web was degreased and etched in sodium hydroxide solution and grained with alternating current in nitric acid, anodized to an oxide weight of 1.0 $g/m^2$, sealed with polyvinyl phosphonic acid. The grain structure was obtained under the following conditions:

Nitric acid concentration: 15.5 g/l

Aluminum nitrate concentration: 60.0 g/l

Charge density at each grainer: 150 Coulombs/$dm^2$

The grained substrate did not appear to be smooth, shiny or ungrained. The charge density for this example is outside of the preferred range of this invention.

TABLE 1

Examples 1 through 10 produce the following substrate values wherein Rz, Ra, Rt and Rp values are in microns:

| Example | Rz | Ra | Rt | Rp | L | a | b |
|---|---|---|---|---|---|---|---|
| 1 | 1.33 | 0.17 | 1.42 | 0.87 | 49 | −1.5 | −1.3 |
| 2 | 2.86 | 0.26 | 3.38 | 1.05 | 57 | −1.3 | −1.4 |
| 3 | 2.94 | 0.27 | 4.88 | 3.82 | 57 | −1.3 | −1.7 |
| 4 | 3.02 | 0.30 | 3.47 | 1.67 | 56 | −1.1 | −1.2 |
| 5 | 2.70 | 0.29 | 4.16 | 2.87 | 57 | −0.8 | 0.6 |
| 6 | 2.35 | 0.30 | 2.99 | 1.78 | 58 | −1.2 | 1.3 |
| 7 | 2.47 | 0.25 | 2.45 | 2.08 | 59 | −1.4 | 0.8 |
| 8 | 2.08 | 0.22 | 2.31 | 1.84 | 57 | −1.0 | 1.1 |
| 9 | 1.87 | 0.21 | 2.88 | 1.57 | 56 | −1.1 | 0.6 |
| 10 | 4.58 | 0.54 | 5.97 | 4.15 | 69 | −4.6 | 3.8 |

What is claimed is:

1. A lithographic printing plate which comprises an aluminum substrate having a grained and anodized surface and having a substantially uniform surface topography comprising peaks and valleys and surface roughness parameters Rz, Rt, Rp, and Ra wherein Ra ranges from about 0.25 to about 0.35 microns, Rz ranges from about 2.50 to about 3.50 microns, Rt ranges from about 2.00 to about 4.00 microns and Rp ranges from about 1.50 to about 2.50 microns and surface tristimulus color coordinate values L, a, and b wherein L ranges from about 56.00 to about 62.00, a ranges from about −1.50 to about +1.50 and b ranges from about −1.50 to about 1.50, and a light sensitive composition layer on the surface.

2. The lithographic printing plate of claim 1, further comprising a hydrophilizing agent on the surface between the light sensitive composition layer and the surface.

3. The lithographic printing plate of claim 2 wherein the hydrophilizing agent comprises polyvinyl phosponic acid.

4. The lithographic printing plate of claim 1 wherein the light sensitive composition layer comprises a photosensitive diazonium compound in admixture with at least one binding resin and at least one colorant.

5. The lithographic printing plate of claim 1 wherein the light sensitive composition layer has a coating weight of from about 0.1 $g/m^2$ to about 2.0 $g/m^2$.

6. The lithographic printing plate of claim 1 wherein the surface has been subjected to one or more treatments selected from the group consisting of a chemical degreasing, chemical etching and electrochemically graining.

7. The lithographic printing plate of claim 1 wherein the surface has been anodized to produce an anodic oxide weight in the range of from about 0.10 to about 1.50 $g/m^2$.

* * * * *